US006883977B2

(12) United States Patent
Dautartas et al.

(10) Patent No.: US 6,883,977 B2
(45) Date of Patent: Apr. 26, 2005

(54) OPTICAL DEVICE PACKAGE FOR FLIP-CHIP MOUNTING

(75) Inventors: Mindaugas F. Dautartas, Blacksburg, VA (US); David W. Sherrer, Blacksburg, VA (US); Neal Ricks, Blacksburg, VA (US); Dan A. Steinberg, Blacksburg, VA (US)

(73) Assignee: Shipley Company, L.L.C., Marlborough, MA (US)

(*) Notice: Subject to any disclaimer, the term of this patent is extended or adjusted under 35 U.S.C. 154(b) by 0 days.

(21) Appl. No.: 10/013,084

(22) Filed: Dec. 10, 2001

(65) Prior Publication Data
US 2003/0095759 A1 May 22, 2003

Related U.S. Application Data
(60) Provisional application No. 60/255,865, filed on Dec. 14, 2000.

(51) Int. Cl.[7] .................................................. G02B 6/36
(52) U.S. Cl. ........................ 385/92; 385/14; 385/49; 385/88; 385/91; 257/433; 257/678; 257/703; 257/704; 257/778; 438/108
(58) Field of Search ..................... 250/227.11, 227.24, 250/227.28, 239; 385/49, 52, 14, 88–94; 257/433, 678, 703, 704, 778; 438/108

(56) References Cited

U.S. PATENT DOCUMENTS

| | | | |
|---|---|---|---|
| 3,404,215 A | 10/1968 | Burks et al. ............... 174/52.2 |
| 3,768,991 A | 10/1973 | Rogers ........................... 65/36 |
| 3,874,549 A | 4/1975 | Hascoe ....................... 220/200 |
| 4,038,157 A | 7/1977 | Kim et al. .................... 204/16 |
| 4,065,203 A | 12/1977 | Goell et al. .................... 385/91 |
| 4,199,222 A | 4/1980 | Ikushima et al. ............ 385/92 |
| 4,270,134 A | 5/1981 | Takeda et al. ................ 257/99 |
| 4,611,884 A | 9/1986 | Roberts .................. 350/96.15 |
| 4,791,075 A | 12/1988 | Lin ............................. 29/837 |
| 4,802,952 A | 2/1989 | Kobori et al. ................ 438/51 |
| 4,818,058 A | 4/1989 | Bonanni ....................... 385/71 |
| 4,826,272 A | 5/1989 | Pimpinella et al. ........ 350/96.2 |
| 4,897,711 A | 1/1990 | Blonder et al. .............. 257/48 |
| 4,904,036 A | 2/1990 | Blonder .................. 350/96.11 |
| 4,907,065 A | 3/1990 | Sahakian .................... 257/684 |
| 5,071,213 A | 12/1991 | Chan ........................... 385/52 |
| 5,291,572 A | 3/1994 | Blonder et al. .............. 385/94 |
| 5,323,051 A | 6/1994 | Adams et al. .............. 257/417 |
| 5,384,872 A | 1/1995 | Jacobs-Cook et al. ........ 385/31 |
| 5,412,748 A | 5/1995 | Furuyama et al. ............ 385/92 |
| 5,448,014 A | 9/1995 | Kong et al. ................. 174/523 |
| 5,454,055 A | 9/1995 | Kragl et al. .................. 385/14 |
| 5,475,778 A | 12/1995 | Webb ........................... 385/31 |
| 5,497,027 A | 3/1996 | Crafts ......................... 257/528 |
| 5,504,372 A | 4/1996 | Braden et al. ............. 257/723 |
| 5,550,398 A | 8/1996 | Kocian et al. ............. 257/434 |
| 5,557,695 A | 9/1996 | Yamane et al. ............... 385/49 |
| 5,562,837 A | 10/1996 | De Givry .................... 216/18 |
| 5,604,160 A | 2/1997 | Warfield .................... 437/209 |
| 5,625,733 A | 4/1997 | Frigo et al. ................... 385/88 |
| 5,631,502 A | 5/1997 | Shimada ...................... 307/43 |
| 5,635,761 A | 6/1997 | Cao et al. ................... 257/700 |

(Continued)

FOREIGN PATENT DOCUMENTS

WO     WO 00/31771     6/2000     ............... 385/14 X

*Primary Examiner*—Brian Healy
*Assistant Examiner*—Daniel Petkovsek
(74) *Attorney, Agent, or Firm*—Jonathan D. Baskin

(57) ABSTRACT

An optical device package includes a substrate; an optical fiber, a frame, and optionally a lid and an optical semiconductor component. The upper surface of the frame includes conductive visa extending vertically to solder balls on its upper surface. Conductive traces along the surface of the substrate provide electrical communication between the optical semiconductor component and the frame. The optical device package is adapted for flip-chip type mounting to a circuit board or other mounting surface.

28 Claims, 6 Drawing Sheets

U.S. PATENT DOCUMENTS

| | | | |
|---|---|---|---|
| 5,647,042 A | 7/1997 | Ochiai et al. | 385/56 |
| 5,656,552 A | 8/1997 | Hudak et al. | 438/15 |
| 5,671,315 A | 9/1997 | Tabuchi et al. | 385/137 |
| 5,699,073 A * | 12/1997 | Lebby et al. | 345/82 |
| 5,727,104 A | 3/1998 | Sasaki et al. | 385/92 |
| 5,734,555 A | 3/1998 | McMahon | 361/704 |
| 5,747,870 A | 5/1998 | Pedder | 257/531 |
| 5,774,614 A | 6/1998 | Gilliland et al. | 385/88 |
| 5,784,780 A | 7/1998 | Loo | 29/840 |
| 5,798,557 A | 8/1998 | Salatino et al. | 257/416 |
| 5,812,571 A | 9/1998 | Peters | 372/36 |
| 5,818,404 A * | 10/1998 | Lebby et al. | 345/82 |
| 5,818,699 A | 10/1998 | Fukuoka | 361/760 |
| 5,915,168 A | 6/1999 | Salatino et al. | 438/110 |
| 5,917,976 A | 6/1999 | Yamaguchi | 385/88 |
| 5,933,558 A | 8/1999 | Sauvageau et al. | 385/88 |
| 5,949,654 A | 9/1999 | Fukuoka | 361/760 |
| 5,960,141 A | 9/1999 | Sasaki et al. | 385/88 |
| 5,966,488 A | 10/1999 | Miura et al. | 385/93 |
| 6,056,448 A | 5/2000 | Sauter et al. | 385/88 |
| 6,061,228 A | 5/2000 | Palmer et al. | 361/306.2 |
| 6,074,104 A | 6/2000 | Higashikawa | 385/94 |
| 6,106,735 A | 8/2000 | Kurle et al. | 216/2 |
| 6,130,979 A | 10/2000 | Isaksson et al. | 385/89 |
| 6,165,885 A | 12/2000 | Gaynes et al. | 438/612 |
| 6,207,950 B1 * | 3/2001 | Verdiell | 250/239 |
| 6,221,753 B1 | 4/2001 | Seyyedy | 438/613 |
| 6,222,967 B1 | 4/2001 | Amano et al. | 385/49 |
| 6,228,675 B1 | 5/2001 | Ruby et al. | 438/106 |
| 6,285,043 B1 * | 9/2001 | Yap | 257/81 |
| 6,318,909 B1 * | 11/2001 | Giboney et al. | 385/90 |
| 6,318,910 B1 | 11/2001 | Higashikawa | 385/94 |
| 6,320,257 B1 * | 11/2001 | Jayaraj et al. | 257/723 |
| 6,376,280 B1 | 4/2002 | Ruby et al. | 438/118 |
| 6,377,742 B1 * | 4/2002 | Go | 385/134 |
| 6,441,481 B1 | 8/2002 | Karpman | 257/711 |
| 6,452,238 B1 | 9/2002 | Orcutt et al. | 257/415 |
| 6,611,001 B1 | 8/2003 | Cappuzzo et al. | 257/81 |
| 6,623,178 B1 * | 9/2003 | Sakurai et al. | 385/92 |
| 6,635,866 B1 * | 10/2003 | Chan et al. | 250/239 |
| 6,680,491 B1 | 1/2004 | Nakanishi et al. | 257/98 |
| 6,690,845 B1 * | 2/2004 | Yoshimura et al. | 385/14 |
| 6,715,935 B1 * | 4/2004 | Mori et al. | 385/88 |
| 6,726,375 B1 * | 4/2004 | Kato et al. | 385/88 |
| 2001/0022382 A1 | 9/2001 | Shook | 257/415 |
| 2002/0090749 A1 | 7/2002 | Simmons | 438/64 |
| 2002/0113296 A1 | 8/2002 | Cho et al. | 257/659 |
| 2003/0034438 A1 * | 2/2003 | Sherrer et al. | 250/216 |
| 2003/0071283 A1 | 4/2003 | Heschel | 257/200 |
| 2003/0081914 A1 * | 5/2003 | Steinberg et al. | 385/94 |
| 2003/0123816 A1 * | 7/2003 | Steinberg et al. | 385/92 |
| 2003/0137022 A1 * | 7/2003 | Dautartas et al. | 257/432 |
| 2004/0012083 A1 | 1/2004 | Farrell et al. | 257/704 |

\* cited by examiner

OPTICAL DEVICE PACKAGE FOR FLIP-CHIP MOUNTING

CROSS REFERENCE TO RELATED APPLICATIONS

This application claims priority to U.S. provisional application Ser. No. 60/255,865 filed Dec. 14, 2000.

BACKGROUND

1. Technical Field

The present disclosure relates to a package for optical devices, and particularly to a module for operatively coupling one or more optical fibers with one or more optical devices.

2. Description of the Related Art

Various optical devices are known in the art and include such semiconductor devices as light emitting diodes (LEDs), laser diodes, and photodetectors. Optical semiconductors, i.e., optoelectronic devices, effect a conversion between optical signals and electronic signals.

Optical semiconductor devices are sensitive to environmental conditions and are generally sealed in hermetic packages or in plastic molding to prevent degradation caused by atmospheric contaminants such as humidity, dust, and free ions. The optical input/output surfaces of the components operatively coupled in a package are especially susceptible to contamination, hence, the desirability of hermetically sealing the package to prevent contact with the outside atmosphere. Hermetic sealing typically involves mounting a cap to a substrate having an optical semiconductor device by means of soldering, welding, and the like.

One prior known optical semiconductor module includes a submount body having a groove buried with an insulator, an optical semiconductor device mounted on the submount body, a cap arranged across the groove and fixedly bonded to the submount body by a bonding member for hermetically sealing the module. An electrical wiring layer connected to the semiconductor device extends to the outside of the cap through a groove buried with an insulator.

Surface mounting technology is often employed to keep the package for an integrated circuit as compact as possible by eliminating certain parts which are unnecessary for the operation of the semiconductor.

In one type of surface mounting technology the bottom surface of a semiconductor device is attached to the top surface of the package substrate. Electrical connections are made between the bonding pads on the top surface of the semiconductor device and the contacts on the mounting surface. The electrical connections are typically made by bonding thin gold or gold alloy wire from the device bonding pads to the electrical connections on the surface. The substrate of the ball grid array package has solder balls on its bottom surface opposite the semiconductor device. Disposed in a grid array, the solder balls are used to make contact with a circuit board. Inside the package are conductive traces which electrically connect the solder balls to the contacts on the top surface of the substrate where the semiconductor device is attached.

However, this method has disadvantages. Wire bonds have high parasitic inductance and are poor conductors of high speed signals, they are labor intensive to manufacture, and are not mechanically robust.

Another mounting method employs a flip-chip. A flip-chip has spaced apart bonding pads disposed on the top surface of the chip rather than just at the periphery. A corresponding array of solder mounting bumps is disposed on the top surface of the substrate onto which the chip is to be mounted. However, the array of bonding pads on the flip-chip and the array of bonding pads on the mounting surface are mirror images of each other. The chip is flipped over so that the individual solder bumps on the chip contact the corresponding solder bumps on the surface of the substrate. The flip-chip is then secured to the surface of the substrate by fusing the solder contacts. By eliminating the wire bonds a package designed for a flip-chip reduces the inductance between the semiconductor device and the substrate. Since the flip-chips have bonding pads arrayed on the entire top surface of the semiconductor device it can have far more bonding pads than a wire bonded chip.

While flip-chip technology is known for mounting semiconductor chips to the surface of a substrate within a package, there is yet need for an optoelectronic device package which can be flip-chip mounted to a circuit board or other mounting platform.

SUMMARY

An optical device package is provided herein which can be flip mounted to a platform. More particularly the optical device package includes a substrate having an upper surface, an optical fiber mounted to the substrate, and a frame mounted to the upper surface of the substrate. The frame has at least one conductive pathway extending between a top surface of the frame and a bottom surface of the frame. The optical device package further includes contact means disposed on the top surface of the frame for flip mounting the optical device package to a platform. Trace means for communicating an electrical signal between the conductive pathway of the frame and an optical semiconductor component are disposed on the upper major surface of the substrate. Preferably, the optical device package includes a lid to provide a hermetically sealed enclosure for the optical semiconductor component and at least a portion of the optical fiber.

The optical device package described herein advantageously provides a flip-chip type mounting capability, thereby reducing the possibility of parasitic inductance and facilitating the transfer of high speed signals.

BRIEF DESCRIPTION OF THE DRAWINGS

Various embodiments are described below with reference to the drawings wherein.

DETAILED DESCRIPTION OF PREFERRED EMBODIMENT(S)

Figure 1A:
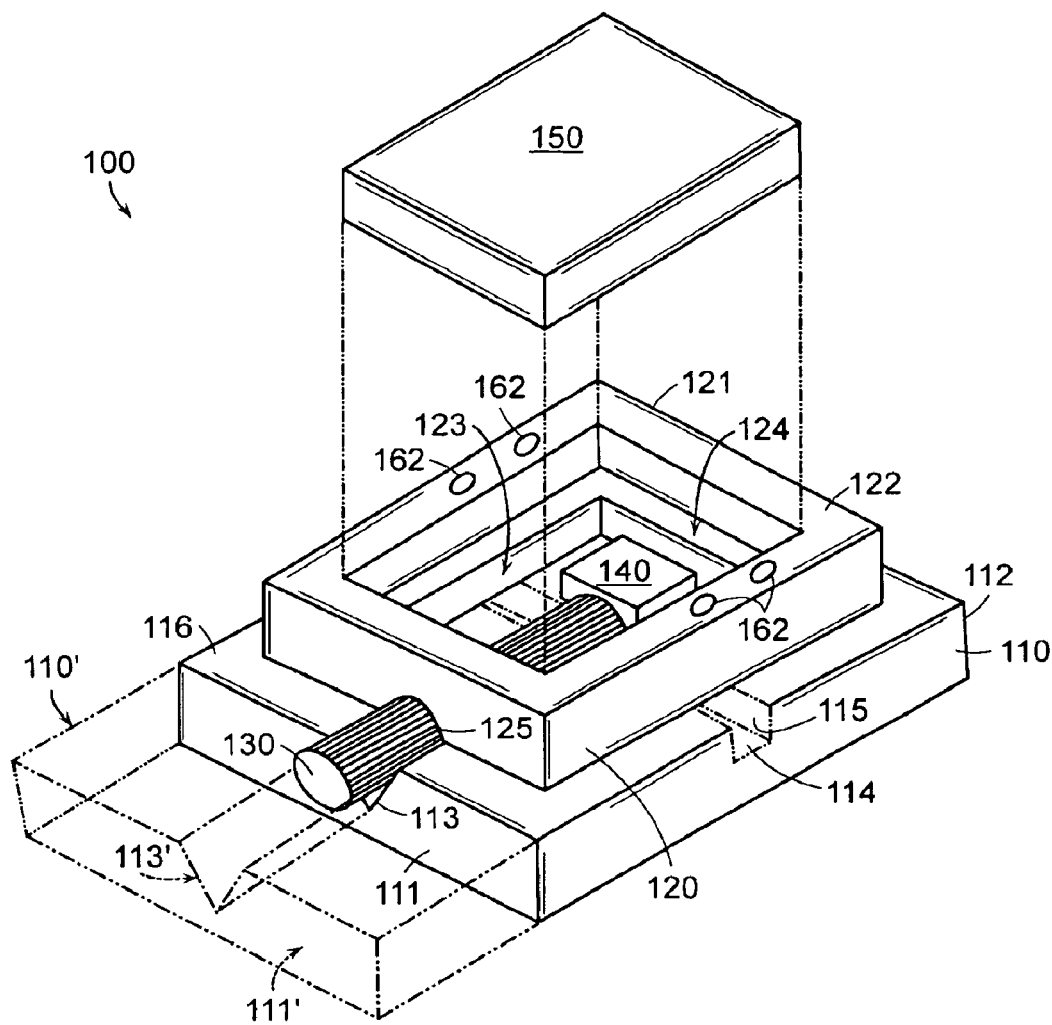
FIG. 1A is an exploded perspective view of an optical device package in accordance with this disclosure.
Figure 2:
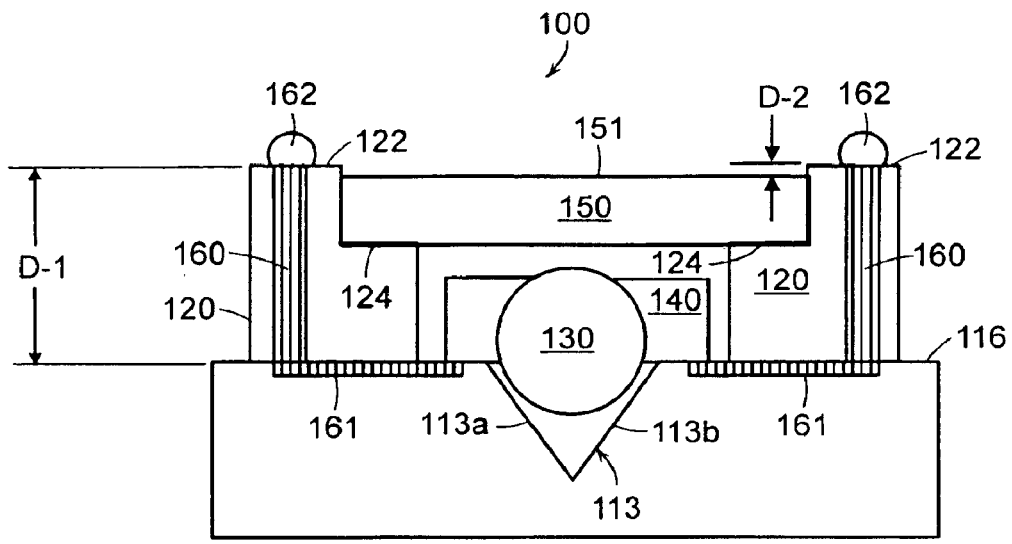
FIG. 2 is a diagrammatic side view of the optical device package.

Referring now to FIGS. 1A and 2, the optical device package 100 includes a substrate 110 in conjunction with an optical fiber stub 130, and optical semiconductor component 140, a frame 120, and preferably also a lid 150.

More particularly, substrate 110 can be made from any material suitable for providing an optical bench. A preferred material for fabricating substrate 110 is silicon. Other suitable materials include ceramic, polymers, and metal. Substrate 110 has a distal end 111, a proximal end 112, and a horizontal upper major surface 116. Substrate 110 is formed by etching and/or cutting or other suitable method to provide a notch 113 extending longitudinally for receiving the optical fiber stub 130, and a lateral groove 114 for providing a distally facing stop surface 115. Lateral groove 114 and stop surface 115, represented in phantom illustration, are optional features. Notch 113 preferably has a V-shaped cross-section and is typically referred to as a "V-groove," although other cross sectional configurations such as U-shaped cross sections are also contemplated. Preferably, substrate 110 is (100) single crystal silicon. The upper surface 116 can be masked and selectively etched to form angled surfaces 113a and 113b (FIG. 2) of the V-shaped notch 113 in the (111) crystallographic planes. The lateral groove 114 can be formed by cutting the upper surface 116 with a dicing saw. The depth of V-shaped notch 113 and lateral groove 114 can be any suitable depth for accommodating the optical fiber 130, and preferably range from about 50 microns to about 500 microns.

The optical fiber 130 can extend beyond distal edge 111 of the substrate. Alternatively, as shown in phantom illustration, substrate 110' and V-shaped groove 113' can be extended such that the distal edge 111' of substrate 110' extends distally further than the distal end of the optical fiber 130.

Figure 1B:
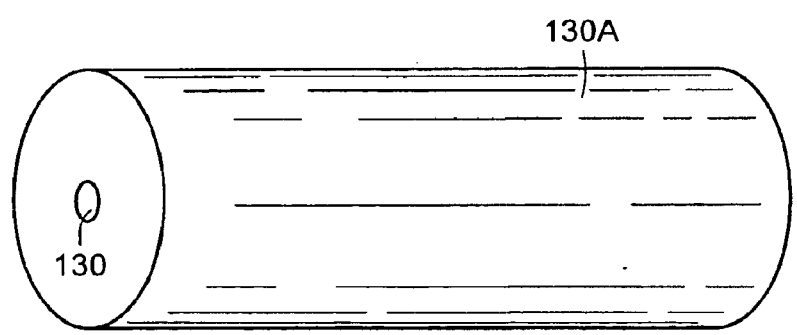
FIG. 1B is a perspective view showing the optical fiber disposed through a ferrule.

Optical fiber stub 130 can be any conventional optical fiber and is typically from about 1 mm to about 5 mm in length, although lengths outside of this range can also be employed when suitable. Optical fiber 130 typically has a diameter of about 125 microns (standard). However, larger or smaller diameters can also be used when suitable. Alternatively, as shown in FIG. 1B the optical fiber 130 can be disposed through a ferrule 130A, the ferrule being disposed between the substrate 110 and frame 120.

The optical fiber 130 is optionally mounted in longitudinal V-shaped notch 113 such that the proximal end of the optical fiber abuts the distally facing stop surface 115 of the optional lateral groove 114.

The optical semiconductor component 140 is preferably mounted on the upper surface 116 of the substrate and can be any suitable semiconductor device for emitting or receiving light such as, for example, a laser diode, light emitting diode (LED), or a photodetector. Such optical semiconductor devices are well known in the art.

A significant feature of the optical device package 100 is that it can be flip-chip mounted to, for example, a circuit board or other mounting platform. The flip-chip mounting ability is facilitated by the frame 120, which is a structural frame distinct from the lid 150 (described below) and which serves as a support for the optical device package when flipped over for mounting to a platform.

Frame 120 is preferably a single piece member having a top surface 122, an interior ledge 124, and a recess 125 configured and dimensioned to accommodate optical fiber 130. Frame 120 preferably has a band-like shape, i.e., frame 120 circumscribes an open area 123, and can be quadrilateral in shape, circular, oval, triangular and the like. Frame 120 is preferably fabricated from a ceramic, glass, silicon, or other suitable material which does not plastically deform at the temperatures used to process and fabricate the present optical device package. Frame 120 can be of any suitable dimensions and preferably has a thickness D-1 of from about 100 microns to about 1,000 microns.

Frame 120 is fixedly bonded to the upper surface 116 of the substrate such that the optical semiconductor device 140 and at least a portion of the optical fiber 130 are disposed within opening 123. Bonding of frame 120 to substrate 110 can be achieved by any suitable means such as soldering with metal, bonding with solder glass frit or BCB (benzocyclobutene resin), or adhesives such as epoxy resins, etc.

Solder glass frit is a low melting point glass such as borate glass, lead zinc borate glass, and the like. Generally, solder glass frit can have a melting point of about 300° C. to about 800° C. Solder glass frit suitable for securing the frame to the substrate is commercially available, for example, from Schott Glass Technologies of Duryea, Pa.

Frame 120 can be metallized or roughened, if necessary, to facilitate soldering or bonding. The portions of the lateral groove 114 beneath the frame can be sealed with a gap filling bonding material (e.g., solder glass frit, epoxy resin, etc.) to provide an hermetically sealed enclosure for the optical semiconductor device if desired.

While the optical device package need not be hermetically sealed in order to function, it is advantageous for the internal components of the optical device package to be secured within an hermetically sealed enclosure to avoid deterioration caused by environmental contaminants such as humidity, dust, corrosive vapors and the like. Therefore, optical device package 100 preferably includes a lid 150 bonded to frame 120 to form an enclosure defined by the substrate 110, frame 120 and lid 150. The optical semiconductor device 140, at least part of the optical fiber 130, and other optional electronic components are contained within the enclosure.

Lid 150 is a flat plate fabricated from any suitable fluid impervious material such as silicon, glass, ceramic, metal, and the like. Lid 150 can be bonded to frame 120 with a bonding material such as solder metal, solder glass frit, adhesives such as epoxy, BCB, and the like.

As can be seen from FIG. 2, lid 150 is positioned on and bonded to the surface of interior ledge 124 of frame 120. The surface of interior ledge 124 can be metallized or roughened to facilitate bonding by solder glass, solder metal, epoxy resin, BCB, and the like. The top surface 151 of the lid is preferably below the level of the top surface 122 of the frame by a distance D-2, wherein D-2 can range from about 5 microns to 250 microns, preferably 10 microns to 200 microns, and more preferably 20 microns to 100 microns.

In order for optical device package 100 to achieve the flip-chip mounting capability, electrically conductive visa 160 are incorporated into frame 120. As can be seen from FIG. 2, frame 120 includes at least one and preferably two or more vertical vias 160, each terminating in a bonding pad, i.e. solder ball 162, disposed on top surface 122. The visa 160 are fabricated from conductive metal and are incorporated into the frame 120 when frame 120 is in a malleable, unhardened state. For example, in a preferred embodiment, frame 120 is fabricated from "green sheets" of ceramic precursor such as alumina, aluminum nitride, silicon nitride, and the like. The green sheets are flexible and easily processed. Holes are punched in the green sheets where interlayer connections or vias are required. Conductive paste can be applied to the sheets to form conductive paths. The holes are filled with conductive paste to form conductive visa and the sheets are stacked and laminated. The laminated stack of green sheets is then fired at a suitably high temperature to form a solid ceramic structure.

In the use of high temperature fired ceramics, the conductive paste can include refractory metals such as tungsten or molybdenum-manganese alloy. In the case of low temperature fired ceramics, the conductive paste can include copper, silver, and/or gold.

Conductive traces 161 preferably are metal films disposed on the upper surface 116 of the substrate. Frame 120 is positioned on the upper surface 116 of the substrate such that the conductive traces 161 are in contact with respective vias 160. The optical semiconductor component 140 is positioned on upper surface 116 of the substrate in contact with the conductive traces 161. The conductive traces 161 form a wiring pattern and can be fabricated, for example, as metal films by masking and vapor deposition, or any other suitable method. As can be seen, the conductive traces 161, conductive vias 160, and solder ball contacts 162 form an electrically conductive path to allow electrical communication between the optical semiconductor component 140 and an electrical circuit outside the optical device package 100.

Figure 3:
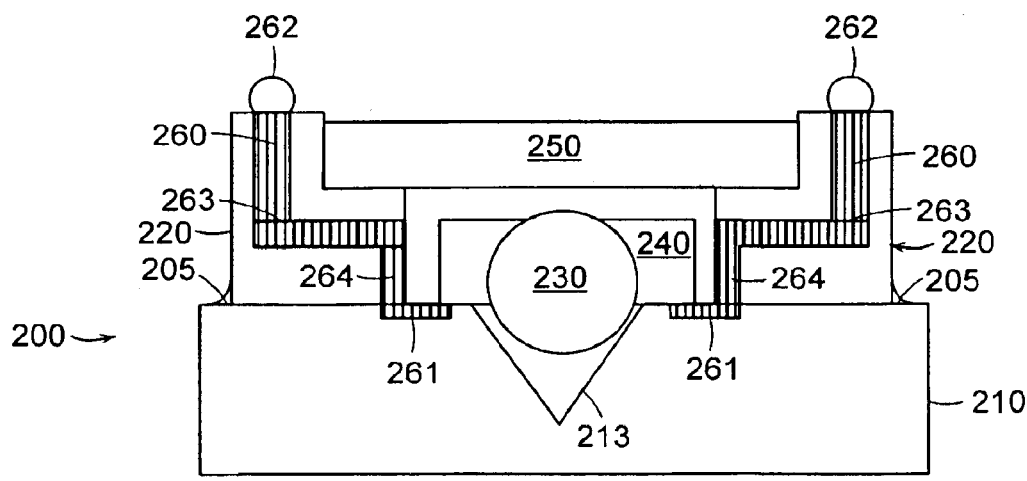
FIG. 3 is diagrammatic side view illustrating an alternative embodiment of the optical device package.

Referring now to FIG. 3, an alternative embodiment 200 is illustrated. Optical device package 200 includes a substrate 210 having a longitudinal V-shaped notch 213 in which an optical fiber 230 is mounted. The optical fiber 230 is operatively aligned with optical semiconductor component 240. A lid 250 is mounted to frame 220.

Frame 220 is secured to the upper surface of substrate 210 by a bonding agent 205 such as solder metal, solder glass, epoxy resin, BCB, and the like. Frame 220 includes one or more solder balls 262 positioned on the upper surface thereof, one or more conductive vias 260 extending vertically downward from the solder balls 262 through the frame, lateral conductive paths 263 extending inward from the respective vias 260, and vertical conductive paths 264 extending vertically along the inside surface of the frame 220 which at least partially defines the interior enclosure in which the optical semiconductor component 240 is mounted. Conductive traces 261 extend from the vertical paths 264 laterally across the upper surface of the substrate 210 to effect electrical communication with the optical semiconductor component 140. As compared with conductive traces 161, traces 261 are narrower and do not need to extend beneath the frame 220.

Figure 4:
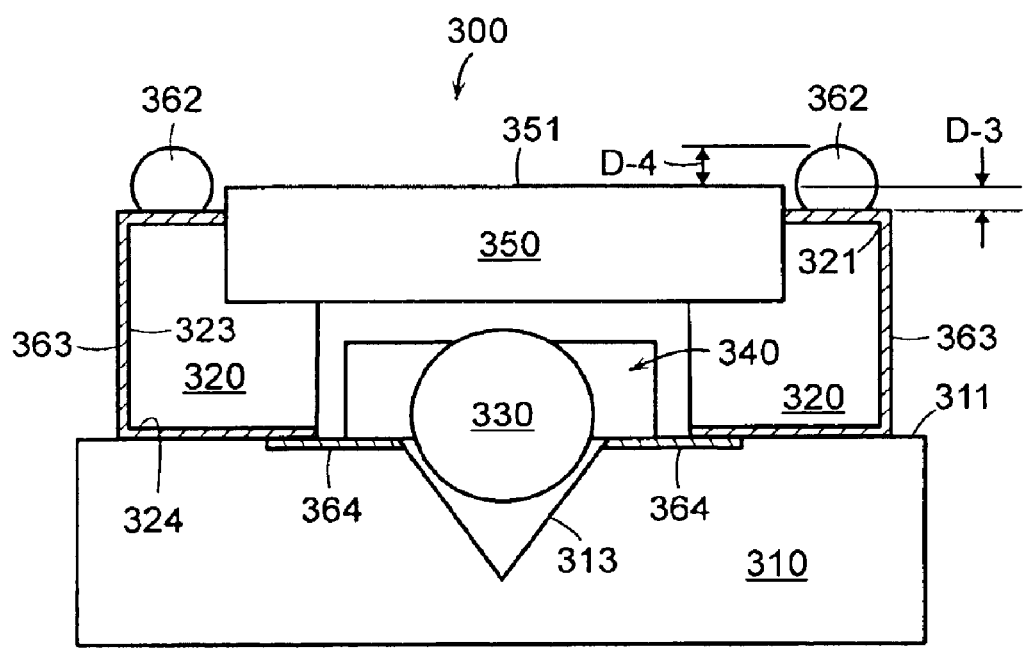
FIG. 4 is a diagrammatic side view illustrating another alternative embodiment of the optical device package.

Referring now to FIG. 4, an embodiment 300 of the optical device package is shown which includes a substrate 310, with longitudinal V-shaped notch 313, an optical fiber 330 mounted within notch 313, an optical semiconductor component 340, and a lid 350 mounted to frame 320. Unlike previously described embodiment 100 as illustrated in FIG. 2, the top surface 351 of lid 350 is higher than the upper surface 321 of frame 320 by a distance D-3. Distance D-3 can range from about 5 microns to 250 microns, preferably 10 microns to 200 microns, and more preferably 20 microns to 100 microns. The elevated position of lid 350 allows lid 350 to function as a heat sink path. Nevertheless, as shown in FIG. 4, the top of the solder balls 362 is at a level higher than the level of the upper surface 351 of the lid by a distance D-4, wherein D-4 can range from about 5 microns to 250 microns, preferably 10 microns to 200 microns, and more preferably 20 microns to 100 microns.

Also, as exemplified in FIG. 4, the conductive pathways associated with frame of any of the embodiments described herein do not necessarily have to extend through the interior of the frame. For example, conductive pathways 363 extend along the exterior surfaces of the frame 320, i.e., along the top surface 321, side surface 323 and bottom surface 324. Electrically conductive traces 364 extend along the upper surface 311 of substrate 310 and provide electrical contact between the conductive pathways 363 and the optical semiconductor component 340, which is mounted to the conductive traces 364.

Figure 5:
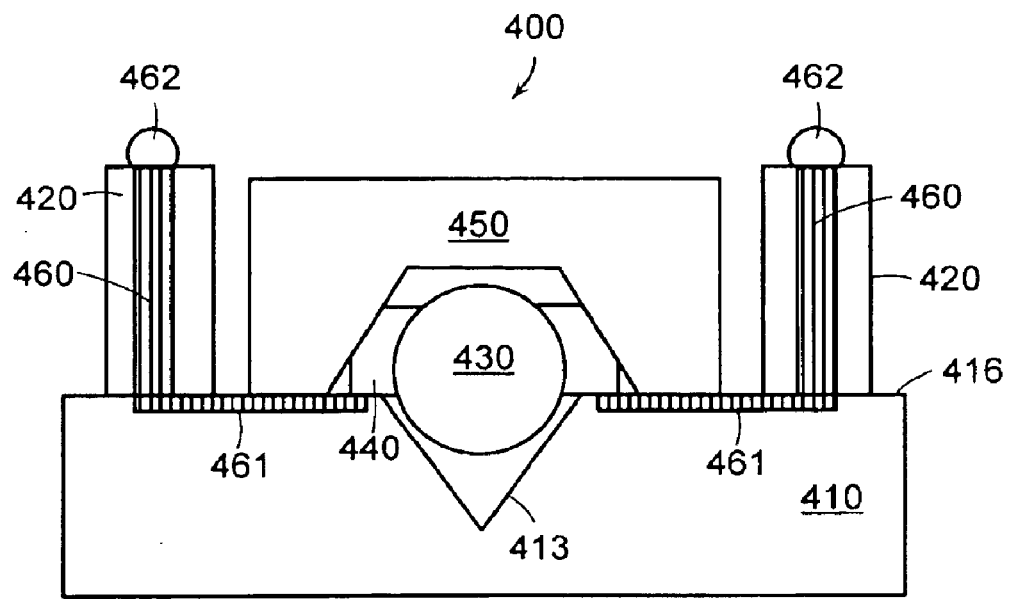
FIG. 5 is a diagrammatic side view illustrating yet another alternative embodiment of the optical device package in accordance with this disclosure employing a lid mounted directly to the substrate.

Referring now to FIG. 5, an alternative embodiment 400 of the optical device package is shown which includes a substrate 410 having a longitudinal V-shaped notch 413, an optical fiber 430 disposed in the notch 413, an optical semiconductor component 440, a frame 420, and a lid 450. However, unlike previously described embodiments, lid 450 is not mounted to frame 420, but rather is sealed directly to the upper surface 416 of substrate 410 with a sealing agent such as described above. Frame 420 includes one or more solder balls 462 on the upper surface thereof, and conductive vias 460. The solder balls 462 are positioned higher than the top surface of lid 450 so that when optical device package 400 is flipped over for mounting to a circuit board or other type platform the solder balls make contact with corresponding bonding pads on the surface to which the optical device package 400 is mounted. Conductive traces 461 extend along the upper surface of the substrate 410 to make an electrical path between the bottom of the conductive vias 460 and the optical semiconductor component 440.

Figure 6:
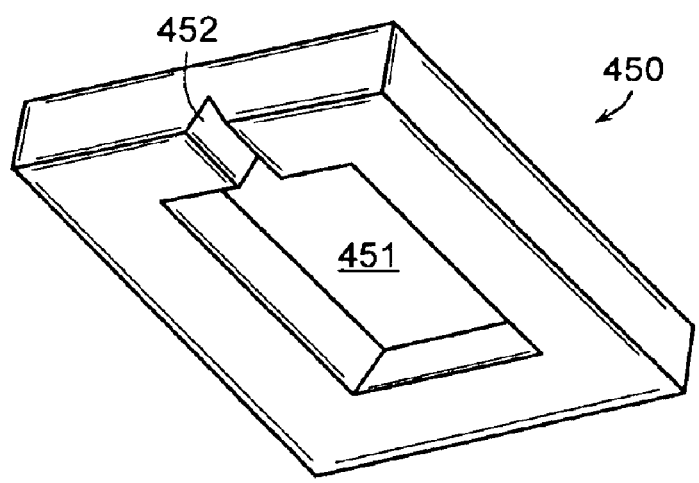
FIG. 6 is a perspective view of a lid for use in conjunction with the embodiment of the optical device package illustrated in FIG. 5.

Referring now to FIG. 6, lid 450 includes a recess 451 to accommodate the optical semiconductor component 440, and a longitudinal notch 452 to engage the optical fiber 430. Lid 450, in conjunction with substrate 410, forms an hermetically sealed enclosure. Frame 420 does not form part of the enclosure, but with vias 460 enables the optical device package 400 to flip mount to a circuit board.

Figure 7:
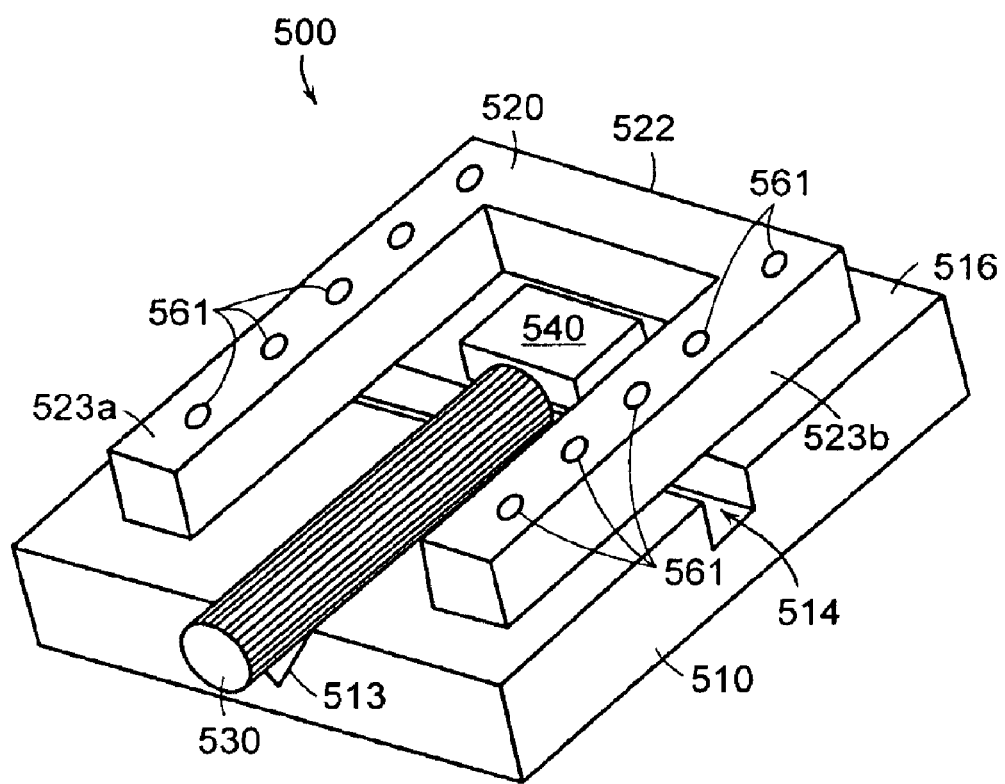
FIG. 7 is a perspective view illustrating a U-shaped frame in conjunction with a substrate, optical fiber and optical semiconductor component; and, FIG. 8 is a perspective view illustrating the flip chip mounting of the optical device package according to the disclosure herein to a circuit board.

Referring now to FIG. 7, a semiconductor device package 500 includes a substrate 510 having a longitudinal V-shaped notch 513 in which optical fiber 530 is fixedly mounted. Optical semiconductor component 540 is mounted to the upper surface 516 of the substrate proximal of the lateral groove 514. In contrast to quadrilateral shaped frames, such as frame 120 illustrated in FIG. 1A, frame 520 is generally U-shaped, including a proximal back portion 522 and leg portions 523a and 523b extending distally from back portion 522.

To achieve an hermetically sealed enclosure, if desired, lid 450 as illustrated in FIG. 6 can optionally be employed in optical device package 500 by being mounted directly to the upper major surface 516 of the substrate between leg portions 523a and 523b of the frame.

Frame 520 includes one or more solder balls 561 disposed on the upper surface thereof. The solder pads 561 are positioned higher than the top surface of lid 450 so that when optical device package 500 is flipped over for mounting to a circuit board or other type platform the solder balls 561 make contact with corresponding bonding pads on the surface to which the optical device package 500 is mounted.

Because the lid 450 and the substrate together form the hermetic enclosure, as described above, and frame 520 does not form part of the enclosure, frame 520 can possess an open ended U-shaped construction while still maintaining an hermetically sealed enclosure for the internal components of the optical device package.

Figure 8:
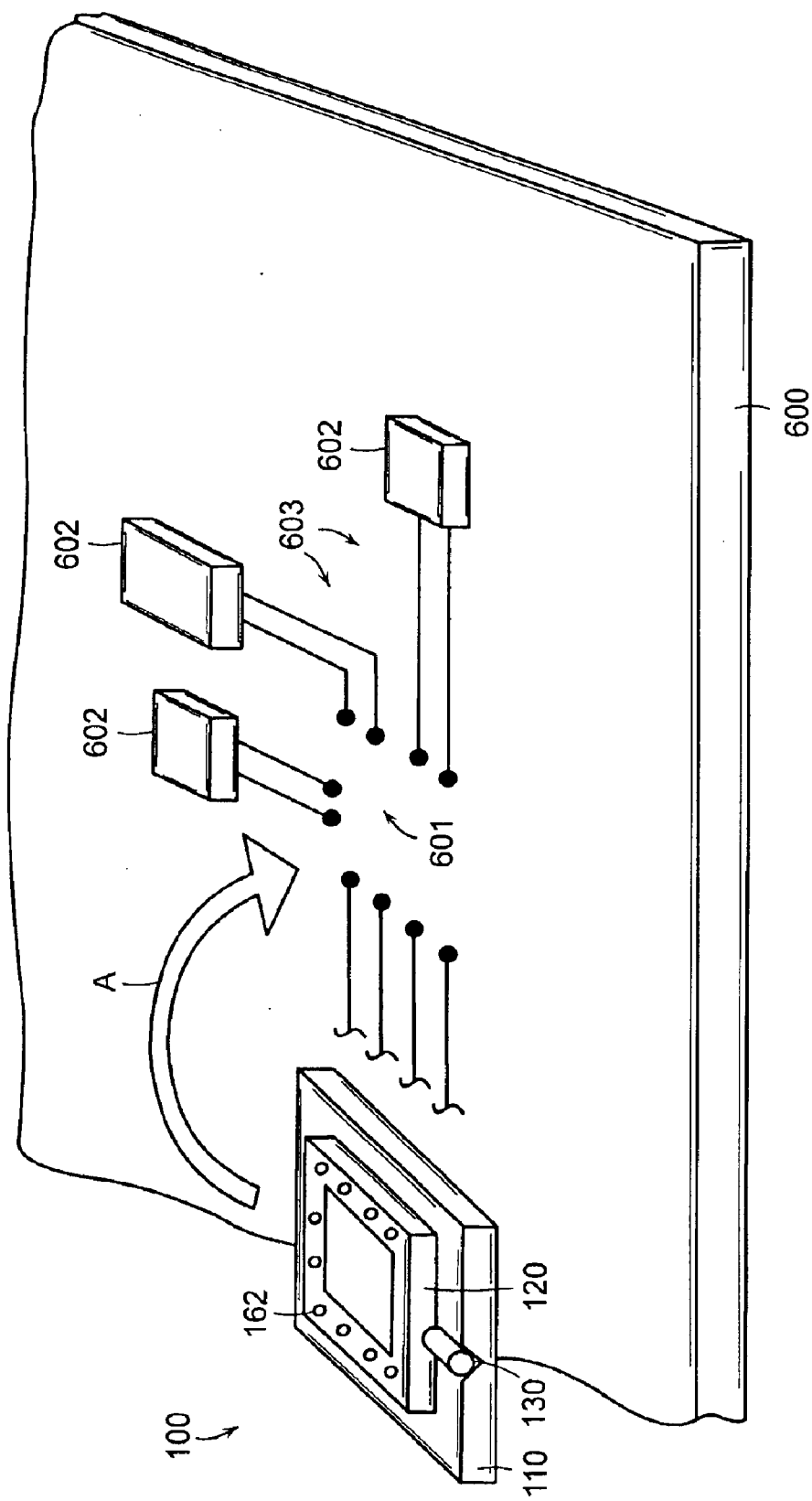

Referring now to FIG. 8 a method mounting the optical device package described herein to a circuit board to assemble an electronic circuit is illustrated.

The optical device package 100 (or the alternative embodiments described herein) is provided having a patterned array of solder balls 162 disposed on the upper surface of frame 120. A circuit board 600 is provided, the circuit board including a patterned array of bonding pads 601 which is a mirror image of the patterned array of solder balls 162. Conductive lines 603 extend from the individual bonding pads to respective electronic devices 602. The optical device package 100 is inverted 159 as indicated by the arrow A, and positioned such that the individual solder balls 162 are in contact with corresponding individual bonding pads 601. The optical device package 100 is permanently secured to the circuit board by, for example, heating solder balls 162 and bonding pads 601 to a temperature sufficiently high to fuse the solder balls and bonding pads together.

While the above description contains many specifics, these specifics should not be construed as limitations on the scope of the invention, but merely as exemplifications of preferred embodiments thereof. Those skilled in the art will envision many other possibilities within the scope and spirit of the invention as defined by the claims appended hereto.

What is claimed is:

1. An optical device package which comprises:
   a) a substrate comprising an upper surface;
   b) an optical fiber mounted to the substrate;
   c) an optical semiconductor component on the substrate;
   d) a frame mounted to the upper surface of the substrate, the frame comprising conductive pathways extending between a top surface of the frame and a bottom surface of the frame, wherein the frame defines an opening from the top surface to the bottom surface, and the optical semiconductor component is disposed in the opening; and
   e) contact means disposed on the top surface of the frame for flip mounting the optical device package to a platform.

2. The optical device package of claim 1 wherein the conductive pathways comprise at least one conductive via which extends through the frame.

3. The optical device package of claim 1 wherein the conductive pathways comprise at least one conductive path which extends along a side surface of the frame.

4. The optical device package of claim 1 wherein the optical fiber is disposed between the substrate and the frame.

5. The optical device package of claim 4 wherein the frame has a recess for accommodating the optical fiber.

6. The optical device package of claim 4 wherein the optical fiber is disposed through a ferrule.

7. The optical device package of claim 2 wherein the contact means comprises at least one solder ball and the at least one conductive via terminates at one end at the solder ball.

8. The optical device package of claim 7 further comprising a conductive trace on the upper surface of the substrate in electrical communication with the conductive pathway of the frame.

9. The optical device package of claim 1 wherein the optical semiconductor component is selected from the group consisting of a laser diode, light emitting diode and photodetector.

10. The optical device package of claim 1 wherein the frame comprises an interior ledge.

11. The optical device package of claim 10 wherein a lid comprising a top surface is mounted to the ledge of the frame such that the top surface of the lid is positioned below the level of the top surface of the frame 12. The optical device package of claim 10 wherein a lid comprising a top surface is mounted to the ledge such that the top surface of the lid is positioned above the level of the top surface of the frame.

13. The optical device package of claim 12 wherein the contact means comprises at least one solder ball comprising a top surface and wherein the top surface of the solder ball is positioned above the level of the top surface of the lid.

14. The optical device package of claim 1 wherein the substrate further comprises a lateral groove defining a distal facing stop surface, and the optical fiber comprises a proximal end abutting the distal facing stop surface.

15. The optical device package of claim 1 wherein the frame comprises a band-like shape circumscribing an open area and comprises a ledge onto which a lid is mounted.

16. The optical device package of claim 1 where the frame comprises a U-shaped configuration and the optical device package comprises a lid mounted to the upper surface of the substrate, the lid comprising a recess.

17. The optical device package of claim 1 wherein the frame is fabricated from a sintered ceramic material.

18. A method for making an optical device package comprising:
   a) mounting an optical fiber to a substrate comprising an upper surface;
   b) forming a conductive trace on the upper surface of the substrate;
   c) mounting a frame to the substrate, the frame comprising a frame top surface with at least one solder pad thereon and a bottom surface, and a conductive via extending from the solder pad to the conductive trace, the frame defining an opening from the top surface to the bottom surface; and
   d) mounting an optical semiconductor component on the substrate in the opening in contact with the conductive trace and in alignment with the optical fiber.

19. The method of claim 18 further comprising mounting a lid to the flame.

20. The method of claim 18 further comprising mounting a lid to the substrate.

21. A method for assembling an electronic circuit comprising:
   a) providing an optical device package which comprises
      i) a substrate comprising an upper surface;
      ii) an optical semiconductor component mounted to the substrate;
      iii) an optical fiber mounted to the substrate in alignment with the optical semiconductor component;
      iv) a frame mounted to the upper surface of the substrate, the frame comprising a top surface with a patterned array of solder balls thereon and a bottom surface, and at least one conductive pathway extending from each solder ball to the upper surface of the substrate, wherein the frame defines an opening from the top surface to the bottom surface, and the optical semiconductor component is disposed in the opening; and
      v) at least one conductive trace electrically connecting the at least one conductive pathway and the optical semiconductor component;

b) providing a circuit board comprising a patterned array of bonding pads which is a mirror image of the patterned array of solder balls on the frame;

c) inverting and positioning the optical device package such that individual solder balls of the patterned array solder balls of the optical device package are in contact with corresponding individual bonding pads of the patterned array of bonding pads on the circuit board; and d) fusing the solder balls to the corresponding bonding pads.

22. The optical device package of claim 1 wherein the optical fiber lies in a groove in the substrate upper surface.

23. The optical device package of claim 1 wherein the package is hermetically sealed.

24. The method of claim 18 wherein the optical fiber lies in a groove in the substrate upper surface.

25. The method of claim 18 wherein the package is hermetically sealed.

26. The method of claim 21 wherein the optical fiber lies in a groove in the substrate upper surface.

27. The method of claim 21 wherein the package is hermetically sealed.

28. The device package of claim 1 where the frame has a U-shaped configuration.

* * * * *